(12) United States Patent
Mauder et al.

(10) Patent No.: US 9,704,718 B2
(45) Date of Patent: Jul. 11, 2017

(54) METHOD FOR MANUFACTURING A SILICON CARBIDE DEVICE AND A SILICON CARBIDE DEVICE

(71) Applicant: Infineon Technologies Austria AG, Villach (AT)

(72) Inventors: Anton Mauder, Kolbermoor (DE); Ralf Otremba, Kaufbeuren (DE); Jens Konrath, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/849,203

(22) Filed: Mar. 22, 2013

(65) Prior Publication Data

US 2014/0284615 A1    Sep. 25, 2014

(51) Int. Cl.
*H01L 29/15* (2006.01)
*H01L 21/308* (2006.01)
(Continued)

(52) U.S. Cl.
CPC ...... *H01L 21/3085* (2013.01); *H01L 29/0619* (2013.01); *H01L 29/0661* (2013.01); *H01L 29/1608* (2013.01); *H01L 29/66068* (2013.01); *H01L 29/7308* (2013.01); *H01L 29/872* (2013.01); *H01L 29/73* (2013.01); *H01L 29/732* (2013.01); *H01L 29/7802* (2013.01)

(58) Field of Classification Search
USPC .......... 257/77, 504, 620, 623, 618; 438/713, 438/718, 113
See application file for complete search history.

(56) References Cited

U.S. PATENT DOCUMENTS 4,904,609 A    2/1990  Temple
6,005,261 A *  12/1999  Konstantinov ..... H01L 29/1608
                                                      257/347
(Continued)

FOREIGN PATENT DOCUMENTS

JP    S54127686 A    10/1979
JP    H04030529       2/1992
(Continued)

OTHER PUBLICATIONS

Jun Hu; "4H-SiC Detectors for Low Level Ultraviolet Detection"; Dissertation to Graduate School—New Brunswick, Rutgers, The State University of New Jersey; Oct. 2008, p. 1-168.
(Continued)

*Primary Examiner* — Benjamin Sandvik
*Assistant Examiner* — Herve Assouman
(74) *Attorney, Agent, or Firm* — Eschweiler & Potashnik, LLC

(57) ABSTRACT

A method for manufacturing a silicon carbide device includes providing a silicon carbide wafer and manufacturing a mask layer on top of the silicon carbide wafer. Further, the method includes structuring the mask layer at an edge of a silicon carbide device to be manufactured, so that the mask layer includes a bevel at the edge of the silicon carbide device to be manufactured. Additionally, the method includes etching the mask layer and the silicon carbide wafer by a mutual etching process, so that the bevel of the mask layer is reproduced at the edge of the silicon carbide device.

18 Claims, 9 Drawing Sheets

(51) Int. Cl.
  *H01L 29/16* (2006.01)
  *H01L 29/66* (2006.01)
  *H01L 29/06* (2006.01)
  *H01L 29/872* (2006.01)
  *H01L 29/78* (2006.01)
  *H01L 29/73* (2006.01)
  *H01L 29/732* (2006.01)

(56) References Cited

U.S. PATENT DOCUMENTS

| | | | |
|---|---|---|---|
| 6,232,229 B1* | 5/2001 | Reinberg | 438/669 |
| 6,573,534 B1* | 6/2003 | Kumar | H01L 29/1608 257/328 |
| 8,076,695 B2 | 12/2011 | Nishimura | |
| 2002/0158345 A1* | 10/2002 | Hedler et al. | 257/786 |
| 2005/0001276 A1* | 1/2005 | Gao | B81C 1/00595 257/417 |
| 2005/0212092 A1* | 9/2005 | Nishizawa | 257/622 |
| 2007/0287298 A1* | 12/2007 | Ishibashi | H01L 21/0332 438/725 |
| 2009/0137098 A1* | 5/2009 | Sakamoto | H01S 5/22 438/462 |
| 2009/0194790 A1* | 8/2009 | Sato | H01L 29/4236 257/192 |
| 2010/0078755 A1* | 4/2010 | Veliadis | H01L 29/0619 257/496 |
| 2011/0156050 A1* | 6/2011 | Okada | H01L 29/045 257/76 |
| 2011/0215435 A1* | 9/2011 | Wakimoto | H01L 21/78 257/504 |
| 2012/0205670 A1* | 8/2012 | Kudou | H01L 21/0465 257/77 |
| 2012/0256192 A1* | 10/2012 | Zhang | H01L 29/0619 257/77 |
| 2012/0292636 A1 | 11/2012 | Zhang et al. | |
| 2013/0062620 A1 | 3/2013 | Henning et al. | |

FOREIGN PATENT DOCUMENTS

| | | |
|---|---|---|
| JP | H08213590 A | 8/1996 |
| JP | H09172081 A | 6/1997 |
| JP | 2001185727 A | 7/2001 |

OTHER PUBLICATIONS

Xing Huang, et al.; "Orthogonal Positive-Bevel Termination for Chip-Size SiC Reverse Blocking Devices"; IEEE Electron Device Letters, vol. 33, No. 11, Nov. 2012, p. 1592-1594.

U. Knipper, et al.; "Time-Periodic Avalanche Breakdown at the Edge Termination of Power Devices"; Proceedings of the 20th International Symposium on Power Semiconductor Devices and IC's; May 18-22, 2008, Orlando, Florida, p. 307-310.

Xiaobin Xin; "Design and Fabrication of 4H-SiC Detectors Towards Single Photon Counting"; Dissertation to Graduate School—New Brunswick, Rutgers, The State University of New Jersey; Oct. 2007, p. 1-212.

* cited by examiner

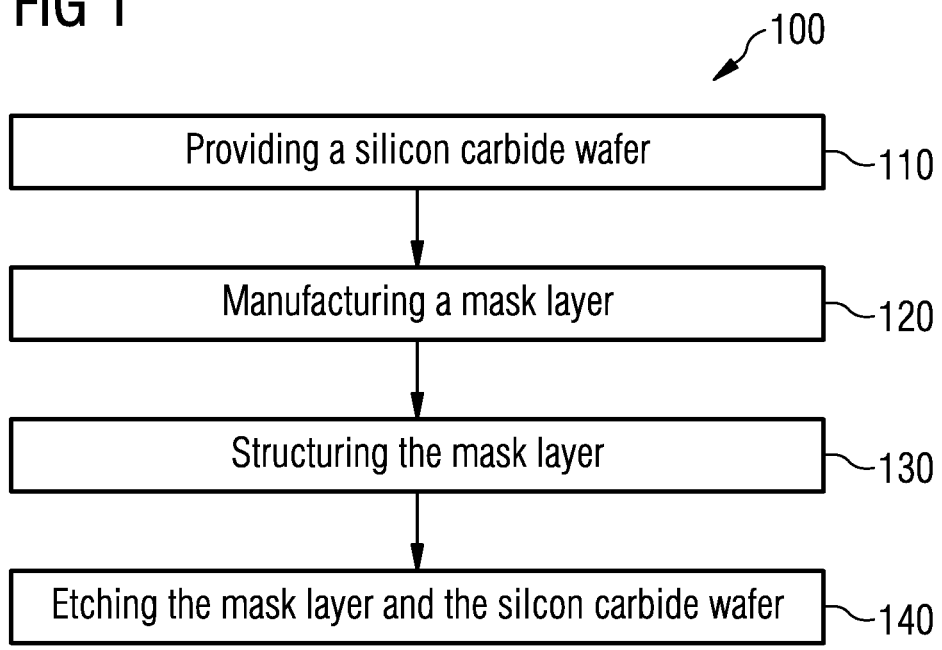
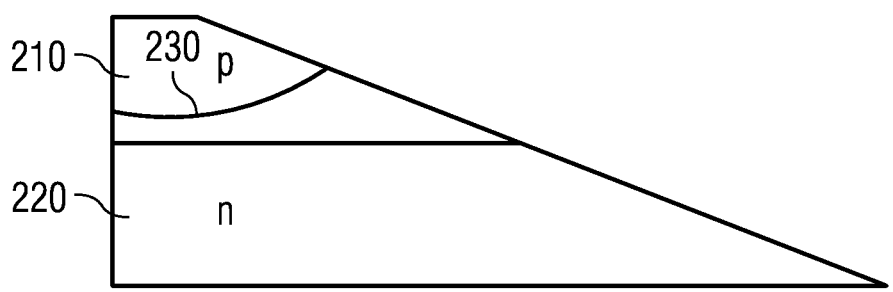

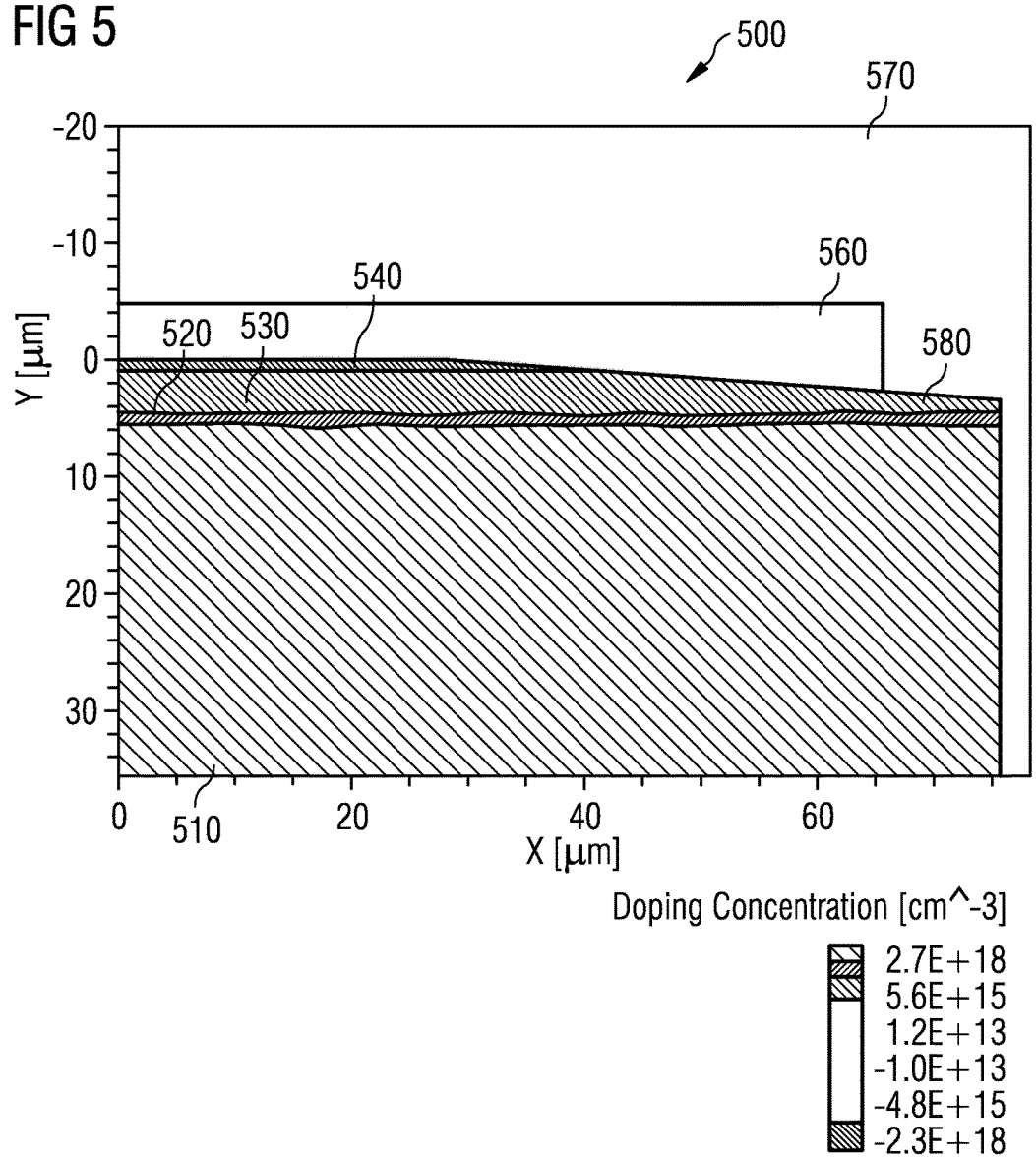

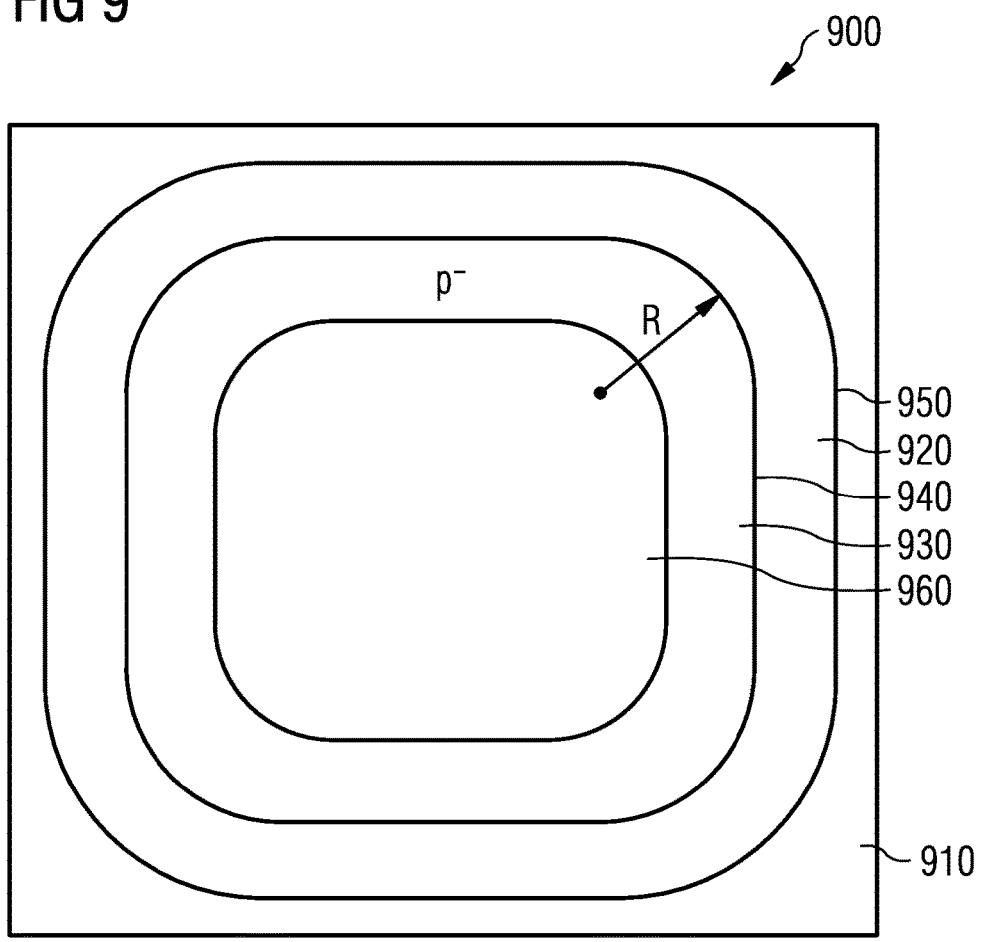

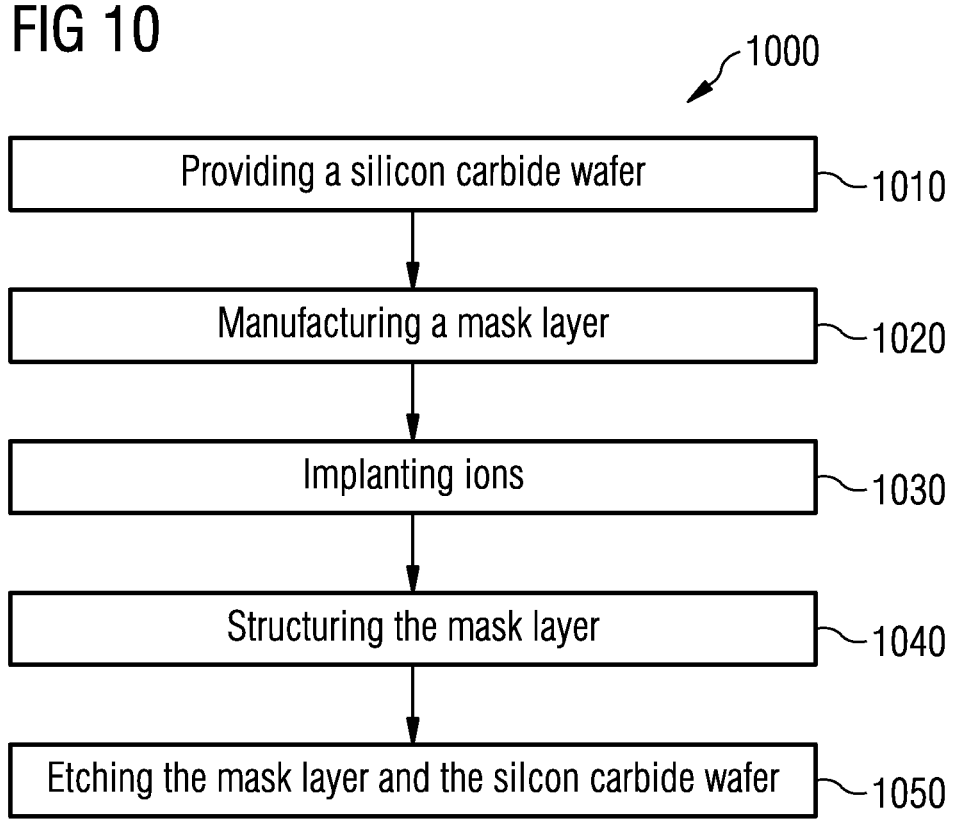
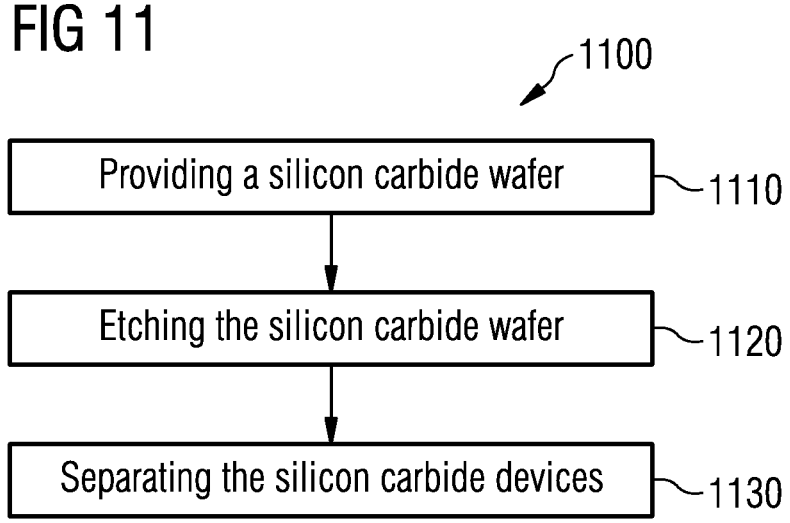

METHOD FOR MANUFACTURING A SILICON CARBIDE DEVICE AND A SILICON CARBIDE DEVICE

FIELD

Embodiments relate to silicon carbide technologies and in particular to a method for manufacturing a silicon carbide device and a silicon carbide device.

BACKGROUND

Silicon carbide devices comprise a breakdown field strength which is similarly high as the maximal tolerable field strength in thermally grown silicon dioxide $SiO_2$ due to the large band gap, if a high long term reliability is required. At the semiconductor surface (e.g. at the edge termination), very high electrical fields occur on silicon carbide devices (SiC-device) which stress at least the passivation layers.

Some possible concepts for edge terminations for silicon carbide are based on junction termination extension (JTE), variation of lateral doping (VLD), field plate and combinations thereof. However, silicon carbide is a very hard material. Therefore, mechanical damages can occur during the separation of the semiconductor, which may be done with a diamond comprising saw blade. In some cases, this may distort the backside metallization and consequently leads to difficulties during assembly or in the long term reliability. Particularly crystal defects can migrate into the active device area. Therefore, a security distance of some micrometers up to some ten micrometers between the saw trace and the edge termination should be kept, which is especially expensive for silicon carbide.

SUMMARY

A method for manufacturing a silicon carbide device according to an embodiment comprises providing a silicon carbide wafer and manufacturing a mask layer on top of the silicon carbide wafer. Further, the method comprises structuring the mask layer at an edge of a silicon carbide device to be manufactured, so that the mask layer comprises a bevel at the edge of the silicon carbide to be manufactured. Additionally, the method comprises etching the mask layer and the silicon carbide wafer by a mutual etching process, so that the bevel of the mask layer is reproduced at an edge of the silicon carbide device.

Due to the bevel, the depletion region of a p-n-junction at the edge of the silicon carbide can be expanded. Therefore, the maximal electrical field strength at the edge of the semiconductor surface can be significantly reduced. Silicon carbide devices with such behavior can be easily manufactured in large numbers by using a mask layer structured with a bevel arranged above the edges of the silicon carbide device to be manufactured and by reproducing the bevel at the edges of the silicon carbide device by etching the mask layer and the silicon carbide wafer by a mutual etching process. Due to the reduced electric field at the edge of the silicon carbide device, the stress for the passivation layers can be significantly reduced, for example. Further, compared to mechanical processes applied to the edge of a silicon carbide device, the reproduction of the bevel at the edge of the silicon carbide device by etching the silicon carbide wafer results in significantly lower crystal defect density and reduced effects of crystal defects.

Some embodiments further comprise implanting ions into the surface region of the mask layer before the structuring of the mask layer, so that the structural homogeneity of the surface region of the mask layer is reduced. In this way, a basically trapezoid-shaped or triangular-shaped slope, window or trench can be obtained by a wet chemical etching process instead of a bowl-shaped trench. So, an approximately even bevel can be manufactured.

In some embodiments, the mask layer is structured, so that the mask layer comprises a bevel surrounding an active area of the silicon carbide device to be manufactured. The bevel of the mask layer surrounds basically a four-sided area with radiused transitions between two neighboring sides of the four-sided area. In this way, the bevel of the mask layer surrounding the active area of the silicon carbide device to be manufactured results in a bevel of the silicon carbide device to be manufactured surrounding the active area of the silicon carbide device to be manufactured. Due to the radiused transitions, the electric field can be reduced in comparison to a geometry with corners.

Some embodiments relate to a Schottky diode, a merged pin Schottky diode, a p-n-diode, a transistor, a metal oxide semiconductor transistor or a junction gate field effect transistor manufactured according to the described concept.

Further embodiments relate to a silicon carbide device comprising a silicon carbide substrate layer comprising a first conductivity type and an epitaxial silicon carbide layer comprising at least one implant area. The at least one implant area is arranged at the edge of the silicon carbide device and comprises a second conductivity type. Further, the epitaxial silicon carbide layer comprises the first conductivity type outside of the at least one implant area. Further, the silicon carbide device comprises a bevel surrounding an active area of the silicon carbide device. The bevel surrounds basically a four-sided area with radiused transitions between two neighboring sides of the four-sided area. The bevel reaches from a surface of the epitaxial silicon carbide layer to at least the pn junction between the implant area and the adjacent part of the epitaxial silicon carbide layer.

The bevel surrounding the active area of the silicon carbide device with radiused transitions between adjacent sides enables a silicon carbide device with low maximal electrical fields at the edge of the silicon carbide device.

BRIEF DESCRIPTION OF THE DRAWINGS

Some embodiments of apparatuses and/or methods will be described in the following by way of example only, and with reference to the accompanying figures, in which FIG. 1 shows a flowchart of a method for manufacturing a silicon carbide device;

FIG. 2 shows a schematic illustration of a cross-section of a bevel of a silicon carbide device;

FIG. 5 shows a schematic illustration of a cross-section of a bevel of a silicon carbide device;

FIG. 9 shows a schematic illustration of a top view of a silicon carbide device;

FIG. 10 shows a flowchart of a method for manufacturing a silicon carbide device; and FIG. 11 shows a flowchart of a method for manufacturing a plurality of silicon carbide devices.

DETAILED DESCRIPTION

Figure 3A:
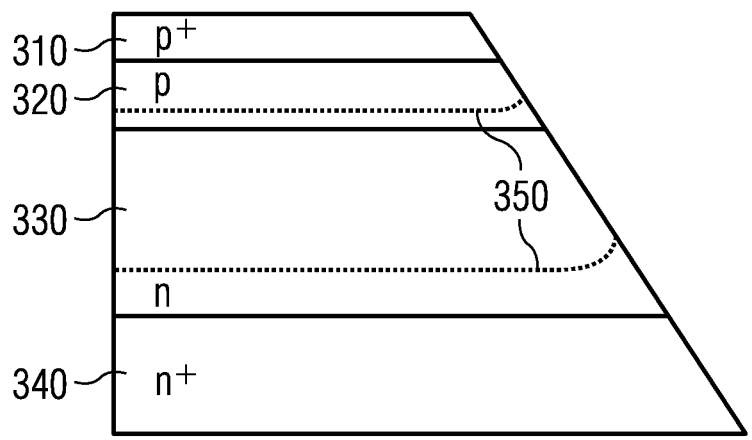
FIG. 3A shows a schematic illustration of a cross-section of a negative bevel of a silicon carbide device.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 2 shows an example of a pn junction at the edge of a silicon carbide device illustrating schematically the principle of a bevel edge termination. A p-doped region 210 on top of an n-doped region 220 at the bevel edge termination of the silicon carbide device is shown. The line within the p-doped region 210 indicates a border of the depletion zone 230 within the p-doped region. Instead of a planar edge termination, an edge termination structured into a vertical and lateral direction is used. A reduction of the doping quantity within the semiconductor material in the region of the edges is obtained due to the reduction of the semiconductor volume resulting in an expansion of the depletion zone 230 along the surface. Due to the extension of the depletion zone 230 at the p-n-junction, the maximal electrical field strength at the semiconductor surface can be reduced. For example, the doping in the p-region 210 would have to exceed the breakdown charge through at least the whole distance to a metal contact. Breakdown charge in this context may mean the amount of depleted acceptor- or donor ions per unit area (e.g. per $cm^2$), when the electric field at the pn-junction reaches the value for avalanche multiplication. This amount of charge may be determined by the semiconductor material and its doping level and may be regarded as a material constant.

Figure 3B:
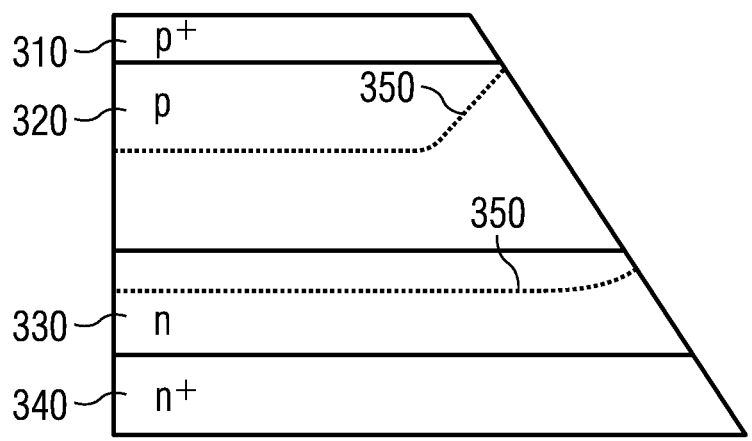
FIG. 3B shows a schematic illustration of a cross-section of a positive bevel of a silicon carbide device.

Similarly, FIGS. 3A and 3B show examples for cross-sections at the edge of a silicon carbide device indicating the depletion zone 350 (dotted line) at a p-n-junction. Depending on the doping concentration of the areas adjacent to the p-n-junction, the depletion zone reaches further into the p-region or further into the n-region. FIG. 3A shows an example with a highly doped p-region 310 on top of a lightly doped p-region 320 adjacent to a lightly doped n-region 330 on top of a highly doped $n^+$-region 340. In this example, the lightly doped p-region 320 comprises a higher doping concentration than the lightly doped n-region 340, so that the depletion zone 350 mainly expands into the lightly doped n-region 340. This configuration can also be called negative angle or negative bevel. FIG. 3B shows a similar structure. However, the lightly doped p-region 320 comprises a lower doping concentration than the lightly doped n-region 330. Further, the lightly doped p-region 320 can be thicker than the lightly doped n-region 330. In this case, the depletion region 350 expands mainly into the lightly doped p-region 320. This configuration is also called positive angle or positive bevel. In both cases, the depletion region 350 is expanded at the surface of the silicon carbide device due to the bevel edge termination.

In other words, a bevel edge termination can be used for a negative angle configuration as well as a positive angle configuration. The depletion zone 350 expands mainly into the n-region 330 at the negative angle and mainly into the p-region 320 at a positive angle. The depletion zone 350 can be extended along the semiconductor surface by reducing the dopant charge within the corresponding semiconductor region. Therefore, the depletion zone 350 extends along the surface deeper into the p-region 320 or the n-region 330, so that the corresponding counter-charge to the charge of the other semiconductor zone can be provided. An enlarged depletion zone 350 may be equivalent with the desired reduction of the electrical field strength at the semiconductor surface due to the relation of voltage=integral over the field strength over the way.

FIG. 1 shows a flowchart of a method 100 for manufacturing a silicon carbide device according to an embodiment. The method 100 comprises providing a silicon carbide wafer at 110 and manufacturing a mask layer on top of the silicon carbide wafer at 120. Further, the method 100 comprises structuring the mask layer at an edge of a silicon carbide device to be manufactured, so that the mask layer comprises a bevel at the edge of the silicon carbide device to be manufactured at 130. Additionally, the method 100 comprises etching the mask layer and the silicon carbide wafer by a mutual etching process, so that the bevel of the mask layer is reproduced at an edge of a silicon carbide device at 140.

Silicon carbide devices with a bevel can be easily manufactured in large numbers, e.g. simultaneously on wafer level, by using a mask layer structured with a bevel arranged above the edges of the silicon carbide device to be manufactured and by reproducing the bevel at the edges of the silicon carbide device by etching the mask layer and the silicon carbide wafer by a mutual etching process. Due to the reduced electric field at the edge of the silicon carbide device, the stress for the passivation layers can be significantly reduced, for example. Further, compared to mechanical processes applied to the edge of a silicon carbide device, the reproduction of the bevel at the edge of the silicon carbide device by etching the silicon carbide wafer results in significantly lower crystal defect density.

A silicon carbide wafer can comprise one or more silicon carbide layers (e.g. epitaxial layers) with different conductivity types (n or p doping) and/or different dopant concentrations. For example, the silicon carbide wafer may comprise a silicon carbide substrate layer and an epitaxial silicon carbide layer grown via epitaxial growth on top of the silicon carbide substrate layer. The silicon carbide substrate layer and the epitaxial silicon carbide layer may comprise the same or different conductivity types. Further, the silicon carbide substrate layer and the epitaxial silicon carbide layer may comprise the same or different dopant concentrations. For example, the silicon carbide substrate layer may comprise a high n-doping (n+) or high p-doping (p+) and the epitaxial silicon carbide layer may comprise a medium or light n-doping (n or n−) or a medium or light p-doping (p or p−).

Further, the epitaxial silicon carbide layer may comprise at least one implant area (e.g. at the surface of the silicon carbide wafer) comprising an opposite conductivity type (p or n doping) compared to the part of the epitaxial silicon carbide layer surrounding the at least one implant area. In this way, a p-n-junction is established between the at least one implant area and the surrounding epitaxial silicon carbide layer. The at least one implant area may comprise further sub areas or sub layers with different conductivity types and/or different doping concentrations. The epitaxial silicon carbide layer may comprise a plurality of such implant areas. The at least one implant area may be located within the epitaxial silicon carbide layer so that one side of the implant area is exposed at the surface of the silicon carbide wafer and apart from this side the other sides may be surrounded by the epitaxial silicon carbide layer, for example.

The silicon carbide wafer can be provided at 110 with an already manufactured layer structure and/or implant areas. Alternatively, the method 100 may comprise additionally the deposition of the epitaxial silicon carbide layer and/or the implant of the at least one implant area, for example.

The mask layer can be manufactured at 120 directly or indirectly (e.g. with at least one other layer between the silicon carbide wafer and the mask layer) on top of the silicon carbide wafer. The mask layer can be manufactured at 120 by growing (e.g. thermal growing) or depositing (e.g. by chemical vapor deposition, CVD) mask layer material on top of the silicon carbide wafer. The mask layer may be a hard mask layer and may comprise or consist of silicon dioxide ($SiO_2$) or silicon nitride ($Si_3N_4$) or silicon (Si), for example. The mask layer may comprise a thickness so that the bevel with a desired length and a desired tilt angle is manufacturable or structurable into the mask layer.

The mask layer can be structured at 130 so that a bevel is obtained at the position of the edge of the silicon carbide device to be manufactured. In other words, a bevel can be structured at 130 into the mask layer aligned to a later edge of the silicon carbide device to be manufactured. Such a bevel can be structured at 130 into the mask layer by manufacturing a basically trapezoid-shaped or triangular-shaped trench into the mask layer so that one side wall of the trapezoid-shaped or triangular-shaped forms the bevel of the mask layer. Depending on the thickness of the mask layer, a trench can be structured through the whole mask layer resulting in a basically trapezoid trench.

The structuring of the mask layer at 130 may be done by a dry chemical or wet chemical etching process. Depending on the material of the mask layer, different processes and/or etching agents can be used. For example, hydrofluoric acid or buffered hydrofluoric acid may be used, if the mask layer comprises or consists of silicon dioxide.

Depending on the concretely used manufacturing process for structuring the mask layer at 130, the bevel may be more or less even or rough and/or comprising more or less curvature.

For example, the structuring of the mask layer at 130 at the position of the edge of the silicon carbide device to be manufactured may be done, so that the mask layer comprises a bevel with a tilt angle of less than 70° (or less than 50°, less than 40°, less than 30°, less than 20° or less than 10°) between a surface of the silicon carbide wafer and an approximated line fitting the structured bevel. Due to the roughness and/or the deviation from a line of the bevel, it may be difficult to determine a tilt angle of the bevel. Therefore, an approximated line can be fitted to the structured bevel (e.g. according to the method of least squares) to determine the mentioned tilt angle.

The bevel of the mask layer (or the silicon carbide wafer) may be a surface of the mask layer (or the silicon carbide wafer), which is not parallel to a surface of the silicon carbide wafer (e.g. before etching the silicon carbide wafer) and not perpendicular to the surface of the silicon carbide wafer.

After manufacturing the bevel at the mask layer, the mask layer and the silicon carbide wafer can be etched at 140 by a mutual etching process. In this way, the bevel of the mask layer can be mapped or reproduced on the silicon carbide wafer. Since the bevel of the mask layer is aligned or adjusted to the edge of the silicon carbide device to be manufactured, also the reproduced edge at the silicon carbide wafer is located at the edge of the silicon carbide device to be manufactured. If the bevel of the mask layer already reaches to the surface of the silicon carbide wafer after structuring the mask layer at 130 (e.g. the etched window, slope or trench forming the bevel reaches through the whole mask layer), then the silicon carbide wafer is etched by the mutual etching process at the already exposed part of the surface. The exposed part of the surface gets larger due to the simultaneous etching of the mask layer at 140. Otherwise, the mask layer can be etched at 140 until the deepest part of the trench forming the bevel of the mask layer reaches the surface of the silicon carbide wafer. From this point, the exposed part of the silicon carbide wafer and the mask layer is etched at 140 simultaneously by the mutual etching process. In this way, the bevel of the mask layer can be reproduced at the silicon carbide wafer.

For example, the tilt angle of the bevel of the mask layer is structured at 130, so that the bevel of the silicon carbide device obtained by the mutual etching at 140 of the mask layer and the silicon carbide wafer comprises a tilt angle between 0.5° and 7° (or between 1° and 15° or between 1° and 30° or between 1° and 10°) between a surface of the silicon carbide wafer (before fabricating the bevel at the silicon carbide wafer) and an approximated line fitting the structured bevel. Similar to the bevel of the mask layer, also the bevel of the silicon carbide wafer or the silicon carbide device to be manufactured may vary more or less from an even or planar geometry. Therefore, the explanations above are also valid for the bevel of the silicon carbide wafer or the silicon carbide device to be manufactured.

For the mutual etching of the mask layer and the silicon carbide wafer at 140, a dry chemical etching process may be used with an anisotropic etching behavior to map or reproduce the bevel of the mask layer to the silicon carbide wafer. Due to the anisotropic etching behavior of the dry chemical etching process, an etching of the silicon carbide wafer beneath the mask layer (undercutting) can be almost completely or completely avoided, for example. An etching process may be anisotropic, if the etch rate in one direction is significantly larger than the etch rate for at least one other direction (e.g. larger than 3 times, 5 times or 10 times the etch rate for at least one other direction).

Depending on the ratio of the etch rate of the mutual etching process for the material of the mask layer and for the silicon carbide wafer (e.g. the layer of the silicon carbide wafer exposed at the surface of the silicon carbide wafer) the tilt of the bevel of the silicon carbide wafer and the tilt of the bevel of the mask layer are basically the same or differ from each other. If the ratio is approximately 1, the tilt angles may be basically the same. Otherwise, the tilt angles may vary more or less from each other, but may still be proportional to the ratio of the etch rates. For example, the mutual etching process may comprise a predefined ratio of an etch rate for the mask layer and an etch rate for the silicon carbide wafer between 1.5 and 0.5 (or between 1.7 and 0.7 or between 1.1 and 0.9). The predefined ratio may depend on the material of the mask layer, the doping concentration of a layer of a silicon carbide wafer exposed at the surface of the silicon carbide wafer and/or the parameters and etching agents used for the mutual dry chemical etching process.

The bevel may surround the whole silicon carbide device to be manufactured or may only be manufactured at portions of the edge, which are exposed to high electrical fields. For example, two opposite sides of a four-sided silicon carbide device may be equipped with bevels, while the other sides may be manufactured with vertical edges.

By the mutual etching process, a three-dimensional structured edge termination of the silicon carbide device to be manufactured can be implemented, for example.

Optionally, the method 100 may additionally comprise implanting ions onto a surface region of the mask layer before the structuring of the mask layer at 130, so that the structural homogeneity of the surface region of the mask layer is reduced. Often wet chemical etching processes (e.g. hydrofluoric acid used for silicon dioxide) comprise a mainly isotropic etching behavior resulting in a bowl-shaped hole, if the etching is started at a point, or a basically circular-shaped trench, if the etching is started along a line. An etching process may be substantially isotropic, if the etch rate for a material varies by less than 30%, less than 20% or less than 10% for all directions. By damaging or reducing the structural homogeneity (e.g. the crystal structure) of a surface region of the mask layer, the etch rate for this reduced homogeneous structure is increased, so that the geometry of the walls of the etched trenches can be influenced, so that a basically triangular-shaped or at basically trapezoid-shaped trench can be obtained providing a basically even (e.g. compared to a trench without the implant of ions at the surface region) bevel.

The surface region of the mask layer may be a part of the mask layer exposed after manufacturing of the mask layer. The depth of the surface region, which is damaged (e.g. made amorphous), may depend on an energy of the ions used for the implantation. The energy may be varied so that the structure of the mask layer may be differently affected in different depths. For example, the energy of the ions can be chosen so that less than the half (or less than 30%, less than 20% or less than 10%) of the thickness of the mask layer are influenced by the implantation of the ions. The amount of damage caused to the mask layer may be further controlled by the dose of the implanted ions.

Optionally, additionally or alternatively, a photoresist layer is used for the structuring of the mask layer at 130 (e.g. by a wet chemical etching process). In other words, the method 100 may optionally further comprise depositing a photoresist layer (directly or indirectly) on top of the mask layer and structuring the photoresist layer, so that the mask layer is structurable or can be structured at 130 by a wet chemical etching process through or via the photoresist layer. The photoresist layer (e.g. lacquer) may be exposed to a radiation source (e.g. light source or an electron beam), so that it can be removed afterwards along the lateral edge of the silicon carbide device to be manufactured and remains at the other areas. During the wet chemical etching process for structuring the mask layer at 130, the etching agent can reach the mask layer through the trench of the photoresist layer aligned to the edge of the silicon carbide device to be manufactured and can remove the mask layer beneath the photoresist layer to obtain triangular-shaped or trapezoid-shaped trenches within the mask layer.

The silicon carbide wafer can be used for manufacturing only one silicon carbide device or a plurality of silicon carbide devices simultaneously. In other words, the mask layer may be structured at 130, so that a trapezoid-shaped trench or a triangular-shaped trench is obtained at the edges of neighboring silicon carbide devices to be manufactured on the silicon carbide wafer. Consequently, the silicon carbide wafer may be etched, so that a trapezoid-shaped trench or a triangular-shaped trench is obtained at the edges of neighboring silicon carbide devices to be manufactured on the silicon carbide wafer due to the trapezoid-shaped trench or the triangular-shaped trench of the mask layer.

The silicon carbide device to be manufactured can be separated from the remaining silicon carbide wafer (e.g. from neighboring other silicon carbide devices) after manufacturing the bevel of the silicon carbide device. In other words, the method 100 may further comprise separating the silicon carbide device to be manufactured from other silicon carbide devices on the silicon carbide wafer. The separation may be done by sawing the silicon carbide wafer, laser cutting or etching.

Further, optionally, the method 100 may comprise further additional or alternative steps for manufacturing metal layers and/or insulation layers on top of the silicon carbide wafer as well as a backside metallization layer or a passivation layer (e.g. silicon nitride, silicon dioxide or silicon oxinitride).

Some silicon carbide devices may comprise an implant area within an epitaxial silicon carbide layer at the edge of the silicon carbide device for reducing the electrical field strength at the edge. Consequently, a p-n-junction occurs at the bevel of the silicon carbide device to be manufactured. For example, a silicon carbide wafer may comprise a silicon carbide substrate layer comprising a first conductivity type and an epitaxial silicon carbide layer comprising at least one implant area. The at least one implant area is arranged at the edge of the silicon carbide device to be manufactured and comprises a second conductivity type. Further, the epitaxial silicon carbide layer comprises the first conductivity type outside of the at least one implant area.

However, the sequence of layers (layer stack) and the conductivity type of the layers can vary. The doping may be also inverted (n-region on top), for example. Starting from the semiconductor surface at the edge, a doping sequence of p/n–/n, p/p–/n, n/n–/p, n/p–/p or other layer sequences can be fabricated or provided, which are not necessarily all etched through. This doping sequence can differ from the doping sequence in the active area (e.g. the central region of the silicon carbide device). Between the mentioned doping at the edge, further doping layers can occur for expanding the depletion zone by the further doping (e.g. based on junction termination extension, variation of lateral doping, field plate and combinations thereof) resulting in a further reduction of the field strength at the edge, for example.

In the example above, the etching of the silicon carbide wafer at 140 may be stopped after at least a part of the resulting trench (e.g. the tip of a triangular-shaped trench or the bottom of a trapezoid-shaped trench) reaches the epitaxial silicon carbide layer comprising the first conductivity type (e.g. surrounding the implant area) or the silicon carbide substrate layer. In other words, the etching of the silicon carbide wafer at 140 may be stopped after removing the implant area at least at one point of a cross-section of the resulting trench (e.g. when the bevel reaches the epitaxial silicon carbide layer beneath the implant area) or if at least one point reaches the silicon carbide substrate layer. In still other words, the etching of the silicon carbide wafer at 140 may be stopped within the epitaxial silicon carbide layer below the implant area or within the silicon carbide substrate layer, so that the bevel of the silicon carbide device reaches from the former surface of the silicon carbide wafer (or do serve face of the area surrounded by the bevel) to the epitaxial silicon carbide layer beneath the implant area or to the silicon carbide substrate layer.

Optionally, additionally or alternatively, the mutual etching of the mask layer and the silicon carbide wafer may be stopped before the mask layer is completely removed (e.g. leaving a thin remaining mask layer on top of the silicon carbide wafer at regions away from the edge of the silicon carbide device to be manufactured) so that the surface can be protected in these regions. In other words, the thickness of the mask layer can be chosen so that a desired depth is reached during the etching of the silicon carbide wafer while a thin part of the mask layer still remains at a central area of the silicon carbide device to be manufactured.

Since more than one silicon carbide device may be manufactured on the silicon carbide wafer, the implant area may reach from an edge region of one silicon carbide device to the edge region of a neighboring silicon carbide device, which will be separated afterwards.

Further, the implant area may optionally surround the silicon carbide device to be manufactured, so that the electrical field can be reduced along the whole edge of the silicon carbide device. For example, the at least one implant area may surround the silicon carbide device to be manufactured and may reach from an edge region of the silicon carbide device to be manufactured to edge regions of neighboring silicon carbide devices to be manufactured before the etching of the silicon carbide wafer.

As is it shown also in FIGS. 3A and 3B, (cross-section through the etched geometry of the upper layers) the etching or the edge or bevel angle can end in the p-region, in the n-drift zone or may reach into the $n^+$-substrate.

Figure 4A:
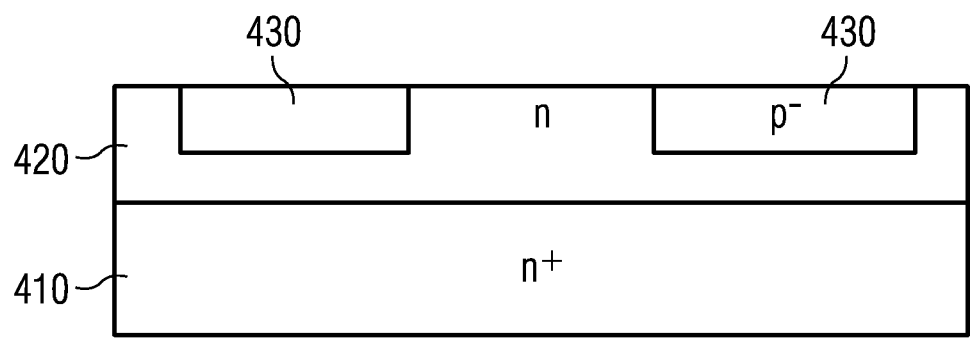
FIGS. 4A to 4D show schematic illustrations of cross-sections of a silicon carbide device during the manufacturing process.
Figure 4B:
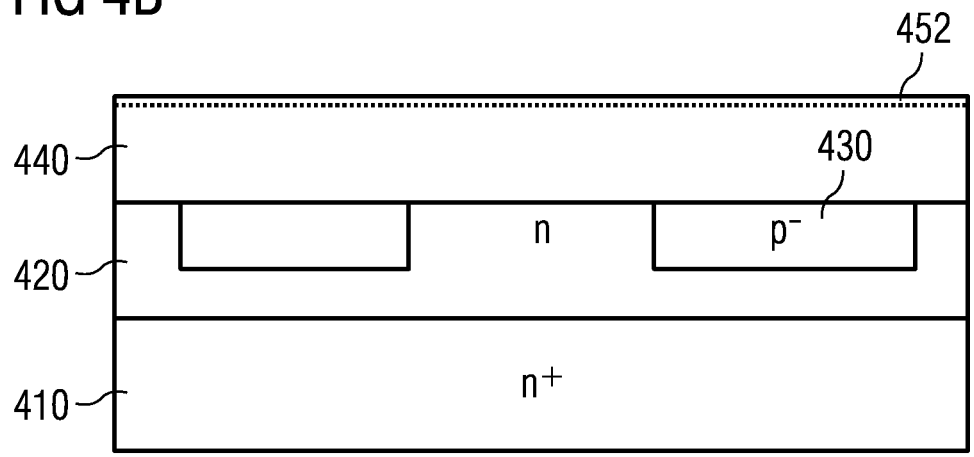
Figure 4C:
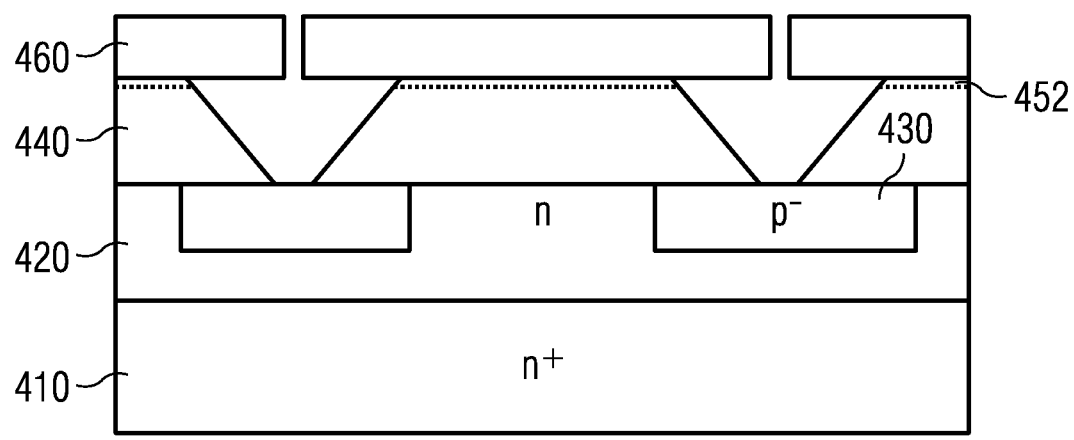

FIGS. 4A to 4D show an example for the manufacturing of a silicon carbide device according to an embodiment. In this example, a silicon carbide wafer with a highly n-doped substrate 410 (n+) and the n-doped drift zone 420 (e.g. epitaxial silicon carbide layer) comprising lightly p-doped implant areas 430 (p–) is provided or manufactured, as shown in FIG. 4A. Then a hard mask (e.g. silicon dioxide, silicon or the like) 440 is deposited on top of the silicon carbide wafer. Further, ions are implanted at the surface region 452 of the hard mask layer (e.g. argon ions) to reduce the structural homogeneity in the surface region 452 as it is indicated by the dotted line in FIG. 4B. Afterwards a photoresist layer 460 (e.g. lacquer) is manufactured on top of the hard mask layer 440. The photoresist layer 460 is removed along the edges of the silicon carbide device to be manufactured. Through these holes, trenches, slopes or windows, the hard mask layer 440 can be etched by a wet chemical etching process or an isotropic dry chemical etching process so that trapezoid-shaped trenches at the edges of the silicon carbide device to be manufactured are obtained. These trenches form a bevel aligned to the edge of the silicon carbide device to be manufactured as it is shown in FIG. 4C. Then the photoresist layer 460 is removed, and the hard mask layer 440 as well as the silicon carbide wafer can be etched by a mutual dry chemical etching process. In this way, the bevel of the hard mask layer 440 can be mapped or reproduced at the silicon carbide wafer. In this example, the etching of the silicon carbide wafer is stopped when the trench or the bevel 418 of the silicon carbide wafer reaches the highly doped silicon carbide substrate layer 410.

Figure 4D:
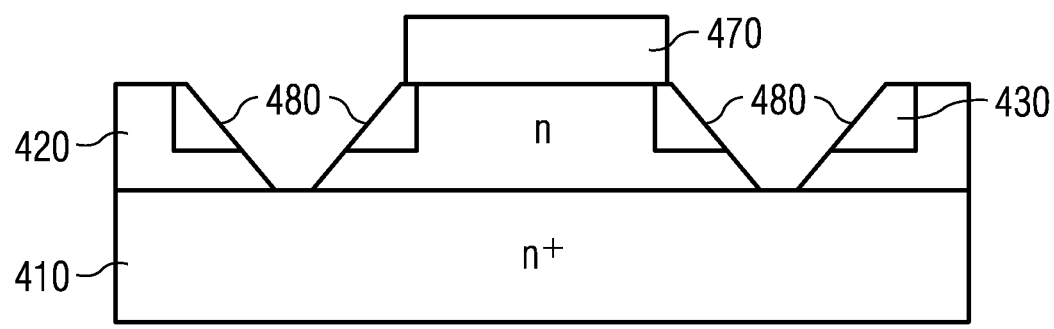

After the mutual etching of the hard mask layer 440 and the silicon carbide wafer, a bevel 480 is obtained at the edges of the silicon carbide devices to be manufactured. Further, after removing the remaining hard mask layer, metal layers or metal contacts 470 as well as insulation layers and/or passivation layers 470 can be manufactured on top of the silicon carbide wafer as shown in FIG. 4D. Finally, the silicon carbide devices may be separated from each other (e.g. by sawing along the bottom of the trenches forming the bevel of the silicon carbide devices).

In other words, FIGS. 4A to 4D show a device for which the p-region at the edge is etched through until the trench reaches the proximity of the highly doped substrate, it ends shortly before it or even enters the substrate. The electrical field extends deeper into the p-region due to the reduction of the acceptor quantity resulting in a reduced electrical field strength at the surface. Edge or bevel angles may lie between 1° and about 30°. Flat angles may lead to further reduced field strength, but also require more area.

At the bottom of the edge regions, a normal separation within the field free space can be carried out. Crystal defects may have no or only neglectable negative influence on the reliability, if it is etched down to the substrate, for example.

Silicon carbide can have a significantly shorter length of drift zones compared to e.g. silicon devices due to a higher critical field strength. Therefore, etched depths can be significantly reduced. In this way, geometric edge terminations are also interesting for chips (e.g. devices significantly smaller than the whole wafer).

According to the described example, a defined angle can be manufactured by fabricating a defined angle within an auxiliary layer (e.g. silicon dioxide, silicon, mask layer) and reproducing this by a strongly anisotropic process to the silicon carbide (e.g. FIGS. 4C and 4D), although chemical etching of silicon carbide is difficult. A triangular undercutting of the oxide or silicon layer (mask layer) can be obtained instead of a bowl-shaped undercutting by an isotropic etching, if the surface of a thermally grown or deposited and/or densified silicon dioxide or silicon layer is damaged by an implantation (e.g. argon). The resulting edge or bevel angle can be adjusted by the implantation dose. In this way, a flat angle can be obtained within the silicon carbide, if the structure is mapped or reproduced to the silicon carbide wafer lying beneath (e.g. by apart from that an unmasked etch process).

Then, the surface of the trench can be covered by a passivation. For example, a layer, which comprises silicon nitride ($Si_3N_4$) deposited in an furnace process (LPCVD, low pressure chemical vapor deposition) can be used, since such a layer represents a good area against ions and moisture. Layers of silicon nitride or so-called oxinitride (mixture of silicon dioxide and silicon nitride) are also possible. Alternatively, also pure silicon dioxide is possible alternatively, which forms a worse barrier against ions and contaminations, but comprises higher acceptable field strengths and is less brittle than silicon nitride. One or more of these layers may also be manufactured using alternative deposition processes like e.g. PECVD (plasma enhanced chemical vapor deposition) or spin-on-processes or the like. A layer stack of different dielectrics may also be possible, so that the different characteristics can be utilized.

An attack of the semiconductor material by electrochemical processes or a diffusion of contaminations into the semiconductor can be prevented in this way. In this view, LPCVD-nitride may be better than PECVD-nitride (plasma enhanced chemical vapor deposition), which is less suitable for a diffusion barrier due to the undefined stoichiometry and the increased tendency to crack formation.

FIGS. 4A to 4D show an example for the manufacturing of an edge termination using the example of a Schottky diode with a Schottky metallization with metal reinforcement 470 (metal) and comparatively a low doped p-region on a highly doped substrate. The p-regions are etched through by mapping or reproducing a hard mask onto the semiconductor material (e.g. FIGS. 4C and 4D), for example. This example is shown without passivation layers.

FIG. 5 shows a schematic cross-section of a silicon carbide device 500 manufactured according to a method described above according to an embodiment. The silicon carbide device comprises a highly n-doped silicon carbide substrate 510 (e.g. n+ with a doping concentration above $1\times10^{18}$ $cm^{-3}$). Followed by a field stop layer 520 with a dopant concentration lower than the silicon carbide substrate 510 and above the neighboring n-doped drift layer 530 (e.g. with a doping between $1\times10^{15}$ $cm^{-3}$ and $1\times10^{18}$ $cm^{-3}$). Further, the silicon carbide device 500 comprises a p-doped implant area 540 with a p-doping (e.g. with a net doping concentration of less than $1\times10^{15}$ $cm^{-3}$). On top of this layer structure, a passivation layer 560 or stack of passivation layers (comprising e.g. imide or silicon nitride) is manufactured. This passivation layer 560 ends in a lateral direction before the vertical edge of the silicon carbide device (e.g. 1 μm, 2 μm, 5 μm or 10 μm before the edge) so that the devices can be easier separated by sawing, for example. In other words, the passivation layer may be structured at the bottom of the trenches (e.g. removing the passivation layer at the bottom of the trenches forming the bevel) in order to avoid the lateral propagation of cracks (e.g. within a nitride or imide). However, the passivation layer 560 can also reach to the vertical edge of the silicon carbide device 500. The silicon carbide device 500 is at least partly surrounded by an encapsulation 570 (e.g. moulding compound or epoxy resin or silicone gel).

In this example, the bevel 580 comprises a tilt angle of 4 degree. With such a flat angle, the electrical field at the beveled surface of the silicon carbide chip can be significantly reduced. The p-doped implant area 540 may comprise a homogenous doping or an inhomogeneous doping which reduced doping concentration at the border to the n-doped drift layer 530.

Figure 6:
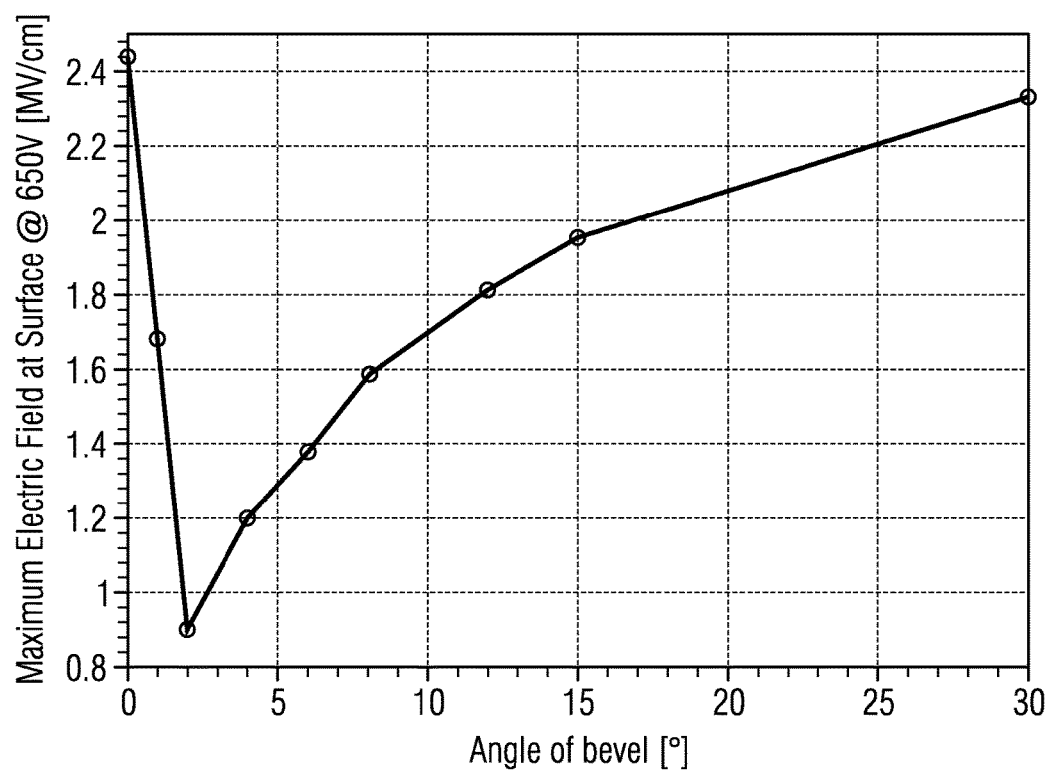
FIG. 6 shows a graph indicating the dependency of the maximum electrical field at the surface on an angle of bevel.

A comparison of a maximum electrical field at the surface (e.g. for a 650 V diode) for different angles of bevel is shown in FIG. 6. Bevels with low angle (e.g. 1 to 5 degree) can significantly reduce the maximum electrical field. However, such flat angles also require more area.

Optionally, additionally or alternatively to one or more aspects described above, the mask layer can be structured, so that the mask layer comprises a bevel surrounding an active area of the silicon carbide device to be manufactured. The bevel of the mask layer surrounds basically a four-sided area with radiused transitions between two neighboring sides of the four-sided area. This bevel of the mask layer surrounding the active area of the silicon carbide device to be manufactured causes or results in a bevel of the silicon carbide device to be manufactured surrounding the active area of the silicon carbide device to be manufactured. In other words, by manufacturing a bevel of the mask layer with radiused transitions, such a bevel can be reproduced at the silicon carbide device. In this way, corners in the region of the bevel at the edge of the silicon carbide device can be avoided so that the electrical field strength can be further reduced.

The active area of a silicon carbide device may be the area mainly used for a current flow during operating the silicon carbide device. The active area of the silicon carbide device may be surrounded by the edge region of the device. Depending on the application and the electrical device realized by the silicon carbide device, this edge region consumes more or less area.

Usually semiconductor dies comprise a rectangular or square-shape. This leads to an increased field at the corners of this geometry. Therefore, the bevel can be manufactured with radiused or rounded transitions (e.g. radiused corners) between neighboring sides or adjacent sides of the active area exposed on the surface of the silicon carbide device. In this way, the bevel may comprise basically a four-sided shape with radiused transitions between neighboring sides (e.g. neglecting variations due to locally different etch rates).

The radiused transitions of the mask layer and the tilt angle of the mask layer may be structured so that the resulting radiused transitions of the four-sided area surrounded by the bevel of the silicon carbide device to be manufactured may comprise a radius at a level of a p-n-junction between the implant area and the adjacent part of the epitaxial layer of more than two times a radius at a level of the surface of the silicon carbide wafer, for example. In other words, the radius at the level of the upper end (the surface of the silicon carbide wafer) is large enough and the tilt angle is flat enough so that a large radius (e.g. more than 2 times, more than 1.5 times or more than 3 times the radius at the upper end) of the bevel at a level of the p-n-junction (at which an expansion of the depletion zone is desired) can be obtained. In this way, the field strength at the radiused transitions is nearly as low as at the straight sides of the four-sided area.

The four-sided area with radiused transition may be an area surrounded by four basically straight sides (e.g. two of them parallel to each other respectively) connected by radiused transitions.

The edge termination in the chip corner can be provided with a radius due to the lithographic structured edge, for example. The chip can still be designed rectangular or quadratic, if the substrate is separated by usual separating techniques (e.g. laser or mechanical sawing). The densification of the lines of electric flux at the chip corners caused by the geometry can be reduced due to the truncation of the active area (e.g. FIG. 9). The radius may be 10 times larger than the radius of the cut off p-n-junction on the chip. Therefore, the chip corner can be implemented with a cut off capability, which is not (significantly) below that of the straight chip edges.

Some embodiments relate to a method for manufacturing a Schottky diode, a merge pin Schottky diode, a p-n-diode, a bipolar transistor, a field effect transistor, a metal oxide semiconductor transistor, a MOSFET (metal oxide semiconductor field effect transistor) or a junction gate field effect transistor. In other words, the silicon carbide device to be manufactured may be a Schottky diode, a merge pin Schottky diode, a p-n-diode, a bipolar transistor, a field effect transistor, a metal oxide semiconductor transistor, a MOSFET (metal oxide semiconductor field effect transistor) or a junction gate field effect transistor. However, also other electrical circuits comprising more of these devices can be realized by the proposed concept.

Figure 7:
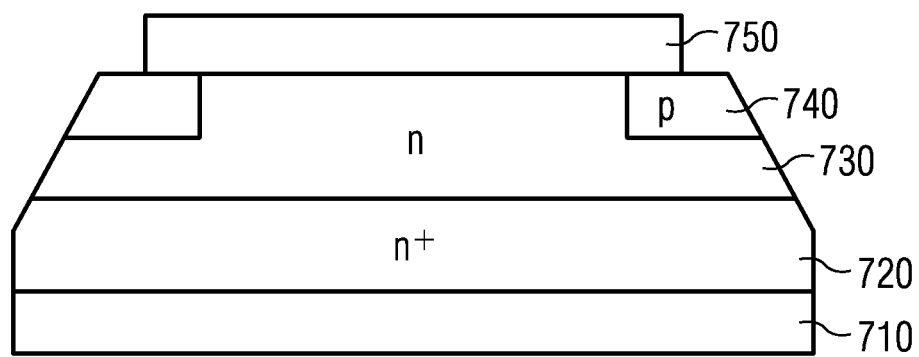
FIG. 7 shows a schematic illustration of a cross-section of a Schottky diode.
Figure 8:
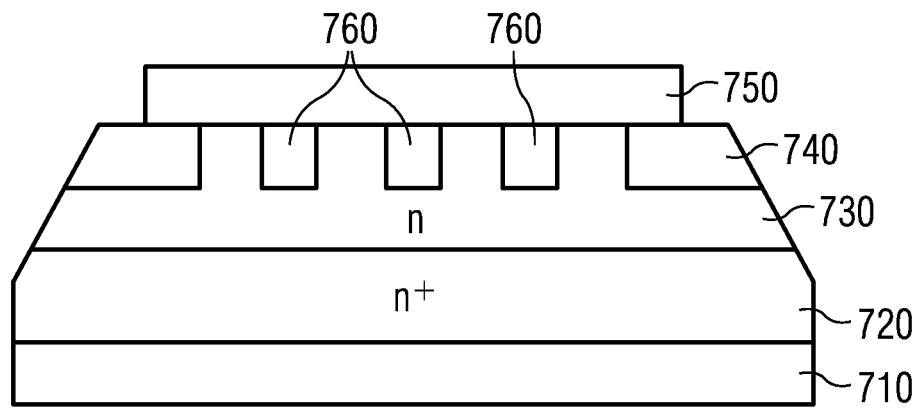
FIG. 8 shows a schematic illustration of a cross-section of a merged pin Schottky diode.

FIG. 7 shows an example of a Schottky diode with a bevel edge termination on silicon carbide representing a silicon carbide Schottky diode. The Schottky diode comprises a highly n-doped substrate 720 followed by a n-doped drift zone 730. At the edge of the Schottky diode a p-doped region 740 is implanted. On top of the silicon carbide die, a Schottky metal 750 is arranged. Further, a cathode metal 710 is manufactured at the backside of the Schottky diode. FIG. 8 shows a similar layer stack for a merged pin Schottky diode. The merged pin Schottky diode comprises, in addition to the p-doped regions 740 at the edge of the device, a plurality of p-doped regions 760 within the active area of the device. The devices as shown in FIG. 7 and FIG. 8 are illustrated without passivation, which can be manufactured on top of the device.

Some embodiments relate to a bevel edge termination by etching. Such edge terminations comprise a chip geometry with varying depth. Such edge terminations are of interest for silicon carbide, since silicon carbide comprises a very high breakdown field strength. Therefore, the depletion zones are also at higher voltages (e.g. in the region of 600 V to 1700 V) comparably thin. According to a rough rule, 1 μm active chip thickness can be estimated per 100 V blocking capability which is about 10% of the thickness of silicon devices with the same blocking capability. Therefore, also with a flat bevel edge termination, the required area can be kept low (e.g. compared to a typical silicon wafer with an active thickness of 60 to 200 μm).

For example, according to the proposed concept, a three-dimensional structured edge termination for silicon carbide chips can be feasible.

The mask may be etched with an isotropic etch. A sloped or tilted edge can be achieved due to the damage at the surface. Dry chemical or wet chemical etching methods may be used. The damages at the surface of the mask may accelerate the etching. The sloped or tilted edge may be transferred to the silicon carbide layer by an anisotropic, hardly selective etching process (e.g. the etch rate may vary less than 30%, less than 20% or less than 10% for different materials to be etched). An etching process may be anisotropic, if the etch rate for a material in one direction is significantly larger than the etch rate for at least one other direction (e.g. larger than 3 times, 5 times or 10 times the etch rate for at least one other direction). An etching process may be substantially isotropic, if the etch rate for a material varies by less than 30%, less than 20% or less than 10% for all directions.

FIG. 9 shows a schematic illustration of a silicon carbide device 900 according to an embodiment. The silicon carbide device 900 comprises a silicon carbide substrate layer 910 comprising a first conductivity type (n or p doping) and an epitaxial silicon carbide layer comprising at least one implant area 920 (e.g. a p$^-$-region or a n$^-$-region), wherein the at least one implant area 920 is arranged at the edge of the silicon carbide device and comprises a second conductivity type (p or n doping). The epitaxial silicon carbide layer comprises the first conductivity type outside of the at least one implant area 920. Further, the silicon carbide device 900 comprises a bevel surrounding an active area 930 of the silicon carbide device 900. The bevel surrounds basically a four-sided area with radiused transitions between two neighboring sides of the four-sided area. Further, the bevel reaches from a surface 940 of the epitaxial silicon carbide layer to at least the p-n-junction 950 between the implant area 920 and the adjacent part of the epitaxial layer.

In other words, alternatively or optionally, the metal layer 960 on top of the silicon carbide indicates the active area of the device. A p-region representing the edge termination surrounds the metal layer 960. This is followed by the bevel (i.e. the sloped or tilted structure), which may be indicated by the lines 940 and 950. The bevel may reach only through the p-region, may end within the n-drift layer or may reach the substrate. For example, the metallurgical p-n-junction may be located between the lines 940 and 950 or may be the line 950 (e.g. if only the p-region is etched through or more). In still other words, the bevel may comprise a radius in the region of a chip corner or die corner, while the chip or die may comprise another geometry (e.g. rectangular).

The bevel surrounding the active area of the silicon carbide device with radiused transitions between adjacent sides enables a silicon carbide device with low maximal electrical fields at the edge of the silicon carbide device.

The active area of a silicon carbide device may be the area mainly used for a current flow during operating the silicon carbide device. The active area of the silicon carbide device may be surrounded by the edge region of the device. Depending on the application and the electrical device realized by the silicon carbide device, this edge region consumes more or less area.

Usually semiconductor dies comprise a rectangular or square-shape. This leads to an increased field at the corners of this geometry. Therefore, the bevel can be manufactured with radiused or rounded transitions (e.g. radiused corners) between neighboring sides or adjacent sides of the active area exposed on the surface of the silicon carbide device. In this way, the bevel may comprise basically a four-sided shape with radiused transitions between neighboring sides (e.g. neglecting variations due to locally different etch rates).

In other words, FIG. 9 shows an example of a separated chip with a geometric edge termination (without passivation shown). The edges of the substrate may represent usual cut through outer edges of the chip (e.g. by wafer sawing).

Optionally, the radiused (or rounded) transitions (e.g. radiused corners) of the bevel and a tilt angle (or edge angle) of the bevel are configured, so that the radiused transitions of the bevel comprise a radius at a level of the p-n-junction 950 between the implant area and the adjacent part of the epitaxial layer of more than 2 times a radius R at a level of the surface 940 of the silicon carbide device 900.

Curved lines indicate the end of the depletion zone in FIGS. 2 and 3. The curvature can be described by a radius. The radius R of the line 940 in FIG. 9 may be significantly larger than the radius of the depletion zone in the cross sections. Some values may be higher than 3 times, higher than 10 times or more. The resulting radius of line 950 may be a consequence of the bevel.

In other words, the radius at the level of the upper end (the surface of the silicon carbide wafer) is large enough and the tilt angle is flat enough so that a large radius (e.g. more than 2 times, more than 1.5 times or more than 3 times the radius at the upper end) of the bevel at a level of the p-n-junction (at which an expansion of the depletion zone is desired) can be obtained. In this way, the field strength at the radiused transitions are nearly as low as at the straight sides of the four-sided area.

Further, the silicon carbide device 900 may optionally comprise a metal layer 960 on top of the active area (e.g. for connecting the silicon carbide device with other electrical elements).

Furthermore, the silicon carbide device 900 may comprise additional, optional features corresponding to one or more aspects of the described concept or one of the embodiments described above FIG. 10 shows a flowchart of a method 1000 for manufacturing a silicon carbide device according to an embodiment. The method 1000 comprises providing a silicon carbide wafer at 1010 and manufacturing a mask layer on top of the silicon carbide wafer at 1020. Further, the method 1000 comprises implanting ions in a surface region of the mask layer at 1030 before the structuring of the mask layer, so that a structural homogeneity of the surface region of the mask layer is reduced, and structuring the mask layer at an edge of a silicon carbide device to be manufactured at 1040, so that the mask layer comprises a bevel at the edge of the silicon carbide device to be manufactured. Additionally, the method 1000 comprises etching the mask layer and the silicon carbide wafer by a mutual etching process at 1050, so that the bevel of the mask layer is reproduced at an edge of a silicon carbide device. The structuring of the mask layer at 1040 at the edge of a silicon carbide device to be manufactured is done, so that the mask layer comprises a bevel with a tilt angle of less than 70° between a surface of the silicon carbide wafer and an approximated line fitting the structured bevel. Further, the structuring of the mask layer at 1040 is done by a wet chemical etching process and the etching of the mask layer and the silicon carbide layer at 1050 is done by a mutual dry chemical etching process.

The method 1000 may comprise further additional, optional features corresponding to one or more aspects of the described concept or one of the embodiments described above.

FIG. 11 shows a flowchart of a method 1100 for manufacturing a silicon carbide device according to an embodiment. The method 1100 comprises providing a silicon carbide wafer with sufficient area for a plurality of silicon substrate devices at 1110 and etching the silicon carbide wafer by a dry chemical etching process at 1120, so that each silicon carbide device of the plurality of silicon substrate devices comprises a bevel surrounding an active area of the silicon carbide devices. Further, the method comprises separating the silicon carbide devices from each other at 1130.

The method 1100 may comprise further additional, optional features corresponding to one or more aspects of the described concept or one of the embodiments described above.

Embodiments may further provide a computer program having a program code for performing one of the above methods, when the computer program is executed on a computer or processor. A person of skill in the art would readily recognize that steps of various above-described methods may be performed by programmed computers.

Herein, some embodiments are also intended to cover program storage devices, e.g., digital data storage media, which are ma-chine or computer readable and encode machine-executable or computer-executable programs of instructions, wherein said instructions perform some or all of the steps of said above-described methods. The program storage devices may be, e.g., digital memories, magnetic storage media such as magnetic disks and magnetic tapes, hard drives, or optically readable digital data storage media. The embodiments are also intended to cover computers programmed to perform said steps of the above-described methods or (field) programmable logic arrays ((F)PLAs) or (field) programmable gate arrays ((F)PGAs), programmed to perform said steps of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is adapted for performing a certain function, respectively. Hence, a "means for s.th." may as well be understood as a "means being adapted or suited for s.th.". A means being adapted for performing a certain function does, hence, not imply that such means necessarily is performing said function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for manufacturing a silicon carbide device, comprising:
    providing a silicon carbide wafer;
    forming an implant area in the silicon carbide wafer at a top surface of the silicon carbide wafer, thereby defining a p-n junction formed by the implant area and the silicon carbide wafer located adjacent to the implant area;
    manufacturing a mask layer on the top surface of the silicon carbide wafer after forming the implant area and defining the p-n junction;
    structuring the mask layer at an edge of a silicon carbide device to be manufactured, so that the structured mask layer comprises a bevel at the edge of the silicon carbide device to be manufactured; and
    etching the structured mask layer and a portion of the top surface of the silicon carbide wafer by a mutual etching process, so that the bevel of the structured mask layer is reproduced in the silicon carbide wafer at the edge of the silicon carbide device to be manufactured;
    wherein the bevel etched into the silicon carbide wafer reaches from the top surface of the silicon carbide wafer down to at least the p-n junction formed by the implant area and the silicon carbide wafer located adjacent to the implant area.

2. The method according to claim 1, wherein the structuring of the mask layer at the edge of a silicon carbide device to be manufactured is done so that the structured mask layer comprises a bevel with a tilt angle of less than 70° between a surface of the silicon carbide wafer and an approximated line fitting the structured bevel.

3. The method according to claim 2, wherein the tilt angle of the bevel of the structured mask layer is structured so that the bevel of the silicon carbide device obtained by the mutual etching of the mask layer and the silicon carbide wafer comprises a tilt angle between 0.5° and 70° between the surface of the silicon carbide wafer and the approximated line fitting the etched bevel of the silicon carbide device to be manufactured.

4. The method according to claim 1, wherein the structuring of the mask layer is done by a wet chemical etching process and the mutual etching of the structured mask layer and the silicon carbide wafer is done by a mutual dry chemical etching process.

5. The method according to claim 1, further comprising implanting ions into a surface region of the mask layer before the structuring of the mask layer, so that a structural homogeneity of the surface region of the mask layer is reduced.

6. The method according to claim 1, further comprising depositing a photo resist layer on top of the mask layer and structuring the photo resist layer, so that the mask layer is structurable by a substantially isotropic wet chemical etching process or a substantially isotropic dry chemical etching process through the structured photo resist layer.

7. The method according to claim 1, wherein the silicon carbide wafer comprises a silicon carbide substrate layer comprising a first conductivity type and an epitaxial silicon carbide layer comprising at least one implant area, wherein the at least one implant area is arranged at the edge of the silicon carbide device to be manufactured and comprises a second, different conductivity type, wherein the epitaxial silicon carbide layer comprises the first conductivity type outside of the at least one implant area.

8. The method according to claim 7, wherein the etching of the silicon carbide substrate wafer is stopped after at least a part of a resulting trench reaches the epitaxial silicon carbide layer comprising the first conductivity type or the silicon carbide substrate layer.

9. The method according to claim 7, wherein the at least one implant area surrounds the silicon carbide device to be manufactured and reaches from an edge region of the silicon carbide device to be manufactured to edge regions of neighboring silicon carbide devices to be manufactured before the etching of the silicon carbide wafer.

10. The method according to claim 1, further comprising separating the silicon carbide device to be manufactured from other silicon carbide devices on the silicon carbide wafer along the bevel.

11. The method according to claim 1, wherein the mask layer is structured, so that a trapezoid-shaped trench or a triangular-shaped trench in the structured mask layer is obtained at the edges of neighboring silicon carbide devices to be manufactured on the silicon carbide wafer, wherein the silicon carbide wafer is etched, so that a trapezoid-shaped trench or a triangular-shaped trench is obtained in the etched silicon carbide wafer at the edges of neighboring silicon carbide devices to be manufactured on the silicon carbide wafer due to the trapezoid-shaped trench or the triangular-shaped trench of the structured mask layer.

12. The method according to claim 1, wherein the mutual etching process comprises a predefined ratio of an etch rate for the structured mask layer and an etch rate for the silicon carbide wafer, wherein the predefined ratio is between 1.5 and 0.5.

13. The method according to claim 1, wherein the mask layer is structured, so that the structured mask layer comprises a bevel surrounding an active area of the silicon carbide device to be manufactured, wherein the bevel of the structured mask layer surrounds basically a four-sided area with radius transitions between two neighboring sides of the four-sided area, wherein the bevel of the structured mask layer surrounding the active area of the silicon carbide device to be manufactured results in a bevel of the silicon carbide device to be manufactured surrounding the active area of the silicon carbide device to be manufactured.

14. The method according to claim 13, wherein the radius transitions of the structured mask layer and a tilt angle of the structured mask layer are manufactured, so that the resulting radius transitions of the four-sided area surrounded by the bevel of the silicon carbide device to be manufactured comprise a radius at a level of a p-n-junction between the implant area and the adjacent part of the epitaxial layer of more than 2 times a radius at a level of the surface of the silicon carbide wafer.

15. The method according to claim 1, wherein the silicon carbide device to be manufactured comprises a Schottky diode, a merged pin Schottky diode, a p-n-diode, a bipolar transistor, a field effect transistor, a metal oxide semiconductor transistor or a junction gate field effect transistor.

16. A method for manufacturing a silicon carbide device, the method comprising:
providing a silicon carbide wafer;
forming an implant area in the silicon carbide wafer at a top surface of the silicon carbide wafer;
manufacturing a mask layer on the top surface of the silicon carbide wafer;
implanting ions in a surface region of the mask layer before a structuring of the mask layer, so that a structural homogeneity of the surface region of the mask layer is reduced;
structuring the mask layer at an edge of a silicon carbide device to be manufactured, so that the structured mask layer comprises a bevel at the edge of the silicon carbide device to be manufactured; and
etching the structured mask layer and a portion of the top surface of the silicon carbide wafer by a mutual etching process, so that the bevel of the structured mask layer is reproduced in the silicon carbide wafer at an edge of a silicon carbide device,
wherein the structuring of the mask layer at the edge of a silicon carbide device to be manufactured is done, so that the structured mask layer comprises a bevel with a tilt angle of less than 70° between a surface of the silicon carbide wafer and an approximated line fitting the structured bevel, and
wherein the structuring of the mask layer is done by a substantially isotropic wet chemical etching process and the mutual etching of the structured mask layer and the silicon carbide layer is done by a mutual substantially anisotropic dry chemical etching process;
wherein the bevel etched into the silicon carbide wafer reaches from the top surface of the silicon carbide wafer down to at least a p-n junction formed by the implant area and a portion of the silicon carbide wafer located adjacent to the implant area.

17. A method for manufacturing a plurality of silicon carbide devices, comprising:
providing a silicon carbide wafer with sufficient area for a plurality of silicon carbide devices;
forming an implant area in the silicon carbide wafer at a to surface of the silicon carbide wafer, thereby defining a p-n junction formed by the implant area and the silicon carbide wafer located adjacent the implant area;
manufacturing a mask layer on top of the silicon carbide wafer; after forming the implant area and defining the p-n junction;
structuring the mask layer at edges of the silicon carbide devices so that the structured mask layer comprises a bevel with a tilt angle of less than 40 degrees between a surface of the silicon carbide wafer and an approximated line fitting the structured bevel;
etching the silicon carbide wafer by a substantially anisotropic etching process down from the to surface of the silicon carbide wafer down to at least the p-n junction formed by the implant area and the silicon carbide wafer located adjacent to the implant area,
so that each silicon carbide device of the plurality of silicon carbide devices comprises a bevel that reaches from the top surface of the silicon carbide wafer down to at least the p-n junction, the bevel surrounding an active area of the silicon carbides; and
separating the silicon carbide devices from each other along the trenches obtained between the bevels of the silicon carbide devices.

18. A method for manufacturing a silicon carbide device, comprising:
providing a silicon carbide wafer;
forming an implant area in the silicon carbide wafer at a top surface of the silicon carbide wafer to form at least a p-n junction between the implant area and the silicon carbide wafer;
manufacturing a mask layer on the top surface of the silicon carbide wafer;
structuring the mask layer at an edge of a silicon carbide device to be manufactured, so that the structured mask layer comprises a bevel at the edge of the silicon carbide device to be manufactured; and
etching the structured mask layer and a portion of the top surface of the silicon carbide wafer by a mutual etching process, so that the bevel of the structured mask layer is reproduced in the silicon carbide wafer at the edge of the silicon carbide device to be manufactured, wherein etching the structured mask layer and the portion of the top surface of the silicon carbide wafer is carried out after forming at least the p-n junction between the implant area and the silicon carbide wafer;
wherein the bevel etched into the silicon carbide wafer reaches from the top surface of the silicon carbide wafer down to at least a p-n junction formed by the implant area and the silicon carbide wafer located adjacent to the implant area.

* * * * *